(12) United States Patent
Takatsuka et al.

(10) Patent No.: US 8,259,207 B2
(45) Date of Patent: Sep. 4, 2012

(54) CCD IMAGE SENSOR

(75) Inventors: Noboru Takatsuka, Kanagawa (JP);
Akira Uemura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 180 days.

(21) Appl. No.: 12/848,503

(22) Filed: Aug. 2, 2010

(65) Prior Publication Data
US 2011/0050971 A1    Mar. 3, 2011

(30) Foreign Application Priority Data
Aug. 31, 2009    (JP) .................... 2009-199389

(51) Int. Cl.
H04N 3/14    (2006.01)
H01L 27/00   (2006.01)
H01L 31/06   (2012.01)
(52) U.S. Cl. ............... 348/311; 250/208.1; 257/465
(58) Field of Classification Search .......... 348/294, 348/302, 311, 317, 319, 320–323; 250/208.1; 257/431, 435, 436, 440, 461–466
See application file for complete search history.

(56) References Cited

U.S. PATENT DOCUMENTS

| | | | |
|---|---|---|---|
| 4,589,005 A * | 5/1986 | Matsuda et al. | 257/250 |
| 5,175,602 A * | 12/1992 | Nam | 257/216 |
| 5,379,067 A | 1/1995 | Miura | |
| 5,583,071 A * | 12/1996 | Stevens et al. | 438/76 |
| 5,705,836 A * | 1/1998 | Agwani et al. | 257/221 |
| 6,528,831 B2 * | 3/2003 | Umetsu et al. | 257/233 |
| 6,646,682 B1 * | 11/2003 | Hou | 348/280 |

FOREIGN PATENT DOCUMENTS

| | | |
|---|---|---|
| JP | 5-283670 | 10/1993 |
| JP | 7-240505 | 9/1995 |
| JP | 2000-236081 | 8/2000 |

* cited by examiner

*Primary Examiner* — Timothy J Henn

(74) *Attorney, Agent, or Firm* — Young & Thompson

(57) ABSTRACT

A CCD image sensor includes a photo-diode region segmented by an element separation region; and a CCD register connected with the photo-diode region through a transfer gate. The photo-diode region includes a plurality of tapered portions, and each of the plurality of tapered portions is formed to become wider in a direction of the transfer gate.

12 Claims, 8 Drawing Sheets

CCD IMAGE SENSOR

INCORPORATION BY REFERENCE

This patent application claims a priority on convention based on Japanese Patent Application No. 2009-199389 filed on Aug. 31, 2009. The disclosure thereof is incorporated herein by reference.

TECHNICAL FIELD

The present invention relates to a CCD image sensor.

BACKGROUND ART

Electronic equipment with a CCD image sensor mounted, such as a mobile phone with a camera and a digital camera has been widely popularized. The CCD image sensor contains a light receiving section that generates and accumulates electric charges based on incident light, and a charge transfer section for transferring the charges. The charges accumulated in the light receiving section of a pixel are read through a read transfer gate. The read transfer gate generates an inclined potential distribution based on an applied voltage. The accumulated charges are transferred and read in accordance with the inclined potential distribution.

In the CCD image sensor, typically, as a pixel size becomes larger, a read time becomes longer. There is a case that the size of the pixel is specified by a user. In such a case, when the large pixel size is specified, it takes a long time to read the charges in a usual structure, and a part of the charges is sometimes remained in the read. For this reason, as a technique which can shorten the read time and suppress the charge remainder, techniques disclosed in Patent Literatures 1 to 3 are known.

FIGS. 1A to 1C are diagrams showing the structure of a CCD image sensor disclosed in the Patent Literature 1. FIGS. 1A to 1C show the structure of one pixel of the CCD image sensor in which the pixel has the width of 10 μm and the length of 20 μm. FIG. 1A is a plan view showing the pixel of the CCD image sensor, FIG. 1B is a sectional view of the CCD image sensor along the line A1-A2, and FIG. 1C is a diagram showing an inclined potential distribution.

The charges are generated through photo-electrical conversion and accumulated in a pixel 101, and then are read through a transfer gate 102 into a CCD register 103. The pixel 101 is separated by an element separation region 104 formed through p-type impurity diffusion. In the technique described in the Patent Literature 1, ion implantation is performed into the pixel to form steps in the potential distribution. As shown in FIG. 1B, the ion implantation is performed two times to accomplish the structure of the CCD image sensor with three steps. With such a structure, the inclined potential distribution toward the transfer gate 102 is generated to improve the read time.

Also, FIGS. 2A to 2D are diagrams showing the structure of a CCD image sensor described in the Patent Literature 2. FIGS. 2A to 2D show the structure of the CCD image sensor in which the pixel has the width of 10 μm and the length of 20 μm. FIG. 2A is a plan view of the CCD image sensor, FIG. 2B is a graph showing an inclined potential distribution along the line A1-A2 shown in FIG. 2A, and FIG. 2C is a cross sectional view along the lines B1-B2 shown in FIG. 2A, and FIG. 2D is a cross sectional view along the lines C1-C2 shown in FIG. 2A.

Referring to FIGS. 2A to 2D, ion implantation is performed to form a p-type tapered impurity diffusion region so as to have an inclined potential distribution in a charge read direction from the pixel 201 to a CCD register 203 through the transfer gate 202. The pixel 201 is separated by an element separation region 204. With such a configuration and narrow channel effect, the inclined potential distribution is generated to reduce the read time.

In the technique described in the Patent Literature 1, although the inclined potential distribution is generated, a range of inclination of the potential distribution generated in one step is limited. Thus, when the pixel length becomes long, the number of steps increases to widen the inclination range. In such a case, one photo-resist mask is required for each step. Therefore, as the pixel length becomes longer, the cost is increased.

Also, the Patent Literature 3 discloses a solid-state image sensing device in which charge transfer efficiency is maximized. In the solid-state image sensing device, a photo-diode has a slender trapezoidal shape in which the widths of both ends are different. Consequently, since an inclined potential distribution can be generated by a photo-diode region and an HCCD region, the transfer efficiency can be improved on the charge transfer side. Therefore, the transfer efficiency can be maintained even if the frequency of a clock signal which is applied to a first polysilicon gate electrode and a second polysilicon gate electrode becomes high.

Citation List:
[Patent Literature 1]: JP 2000-236081A
[Patent Literature 2]: JP-A-Heisei 5-283670
[Patent Literature 3]: JP-A-Heisei 7-240505

SUMMARY OF THE INVENTION

As mentioned above, in a product in which the width and length of one pixel are 10 μm and 20 μm and a product in which the width and length of one pixel are 10 μm or less in both, there is no problem if one tapered region is provided for one pixel. However, when a pixel size in which the width of one pixel is wider than 10 μm is specified, it was discovered that the read time became longer in the product with one taper provided for one pixel. This problem is not recognized in the conventional techniques. This could be considered because the narrow channel effect does not affect since the width is wider.

FIGS. 3A to 3C show a structure of a CCD image sensor studied by the inventor of the present invention to apply the technique described in the Patent Literature 1 to a CCD image sensor in which the width and length of a pixel are 10 μm and 60 μm. FIG. 3A is a plan view showing the configuration of the CCD image sensor, FIG. 3B is a sectional view of the pixel along line A1-A2 in FIG. 3A, and FIG. 3C is a diagram showing a stepped inclined potential distribution along the line A1-A2 in FIG. 3A. Charges are generated through photo-electrical conversion and accumulated in the pixel 301, and then are read through a transfer gate 302 into a CCD register 303. The pixel 301 is separated by an element separation region 304. The CCD image sensor shown in FIGS. 3A to 3C has a potential structure of three steps. However, since the pixel length is long, a range of inclination of the potential distribution is narrow. Thus, in this case, it would take a long read time.

FIGS. 4A and 4B are diagrams showing the configuration of the CCD image sensor studied by the inventor of the present invention to apply the technique described in the Patent Literature 2 to the CCD image sensor in which the width and length of one pixel are 20 μm and 10 μm. FIG. 4A is a plan view of the CCD image sensor and FIG. 4B is a diagram showing an inclined potential distribution along the line A1-A2 in FIG. 4A. Charges are generated through photo-electrical conversion and accumulated in the pixel 401, and then are read through a transfer gate 402 into a CCD register 403. The pixel 401 is separated by an element separation region 404.

In the technique described in the Patent Literature 2, when the width of the pixel becomes wider, the channel width becomes wider, which reduces the narrow channel effect. Thus, the inclined potential distribution is not generated, and it takes a long read time. When a dose amount of the ion implantation into the tapered region is increased as counter-measures studied by the inventor of the present invention, the read property is somewhat improved. FIGS. 5A to 5C show the structure of the CCD image sensor when a dose amount of impurity into the tapered region in the ion implantation is increased. FIG. 5A is a plan view of the CCD image sensor, and FIG. 5B is a sectional view of the CCD image sensor along the line B1-B2 shown in FIG. 5A and FIG. 5C is a sectional view of the CCD image sensor along the line C1-C2 shown in FIG. 5A. Charges are generated through photo-electrical conversion and accumulated in the pixel 501, and then are read through a transfer gate 502 into a CCD register 503. The pixel 501 is separated by an element separation region 504.

As shown in FIGS. 5A and 5B, P+ tapered ion implantation region cancels the effect of a p-n junction in the photo-electric conversion. However, when an amount of impurity is excessively increased, this cancels the effect of the p-n junction in the photo-electric conversion of the pixel. That case may cause a problem that uniform sensibility cannot be provided in the entire pixel.

In an aspect of the present invention, a CCD image sensor includes: a photo-diode region segmented by an element separation region; and a CCD register connected with the photo-diode region through a transfer gate. The photo-diode region includes a plurality of tapered portions, and each of the plurality of tapered portions is formed to become wider in a direction of the transfer gate.

According to the present invention, a signal charge can be read from a pixel of any size without defective read.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Figure 1:
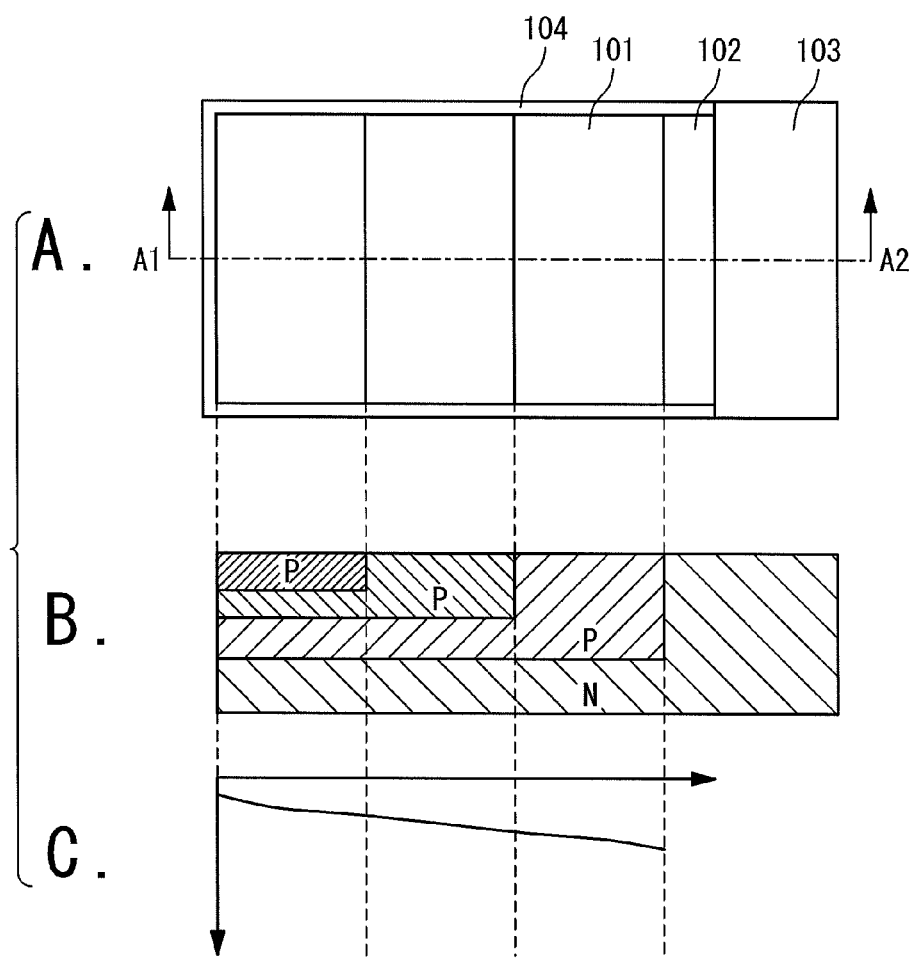
FIGS. 1A, 1B and 1C show the structure of a first conventional CCD image sensor.
Figure 2:
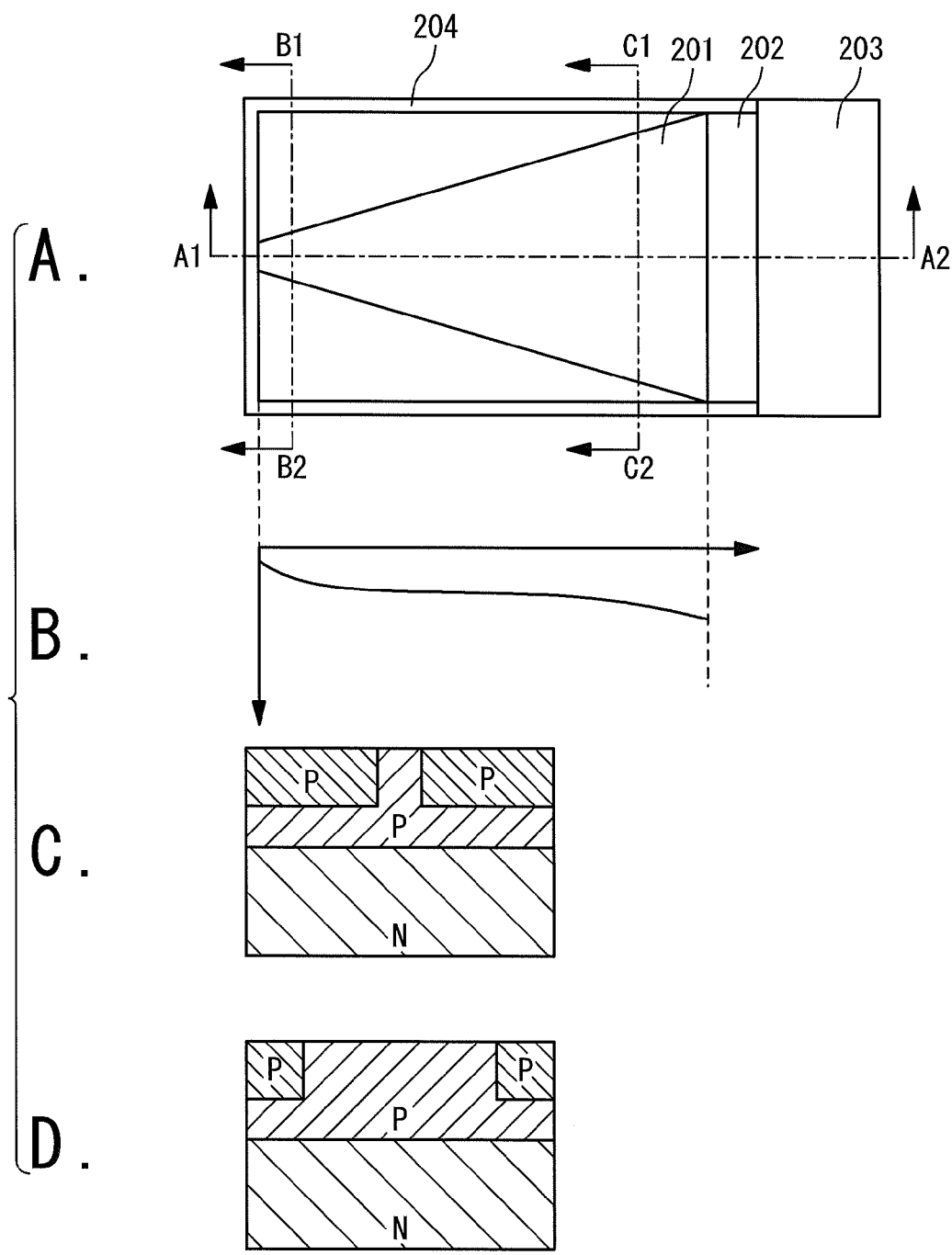
FIGS. 2A, 2B, 2C and 2D show the structure of a second conventional CCD image sensor.
Figure 3:
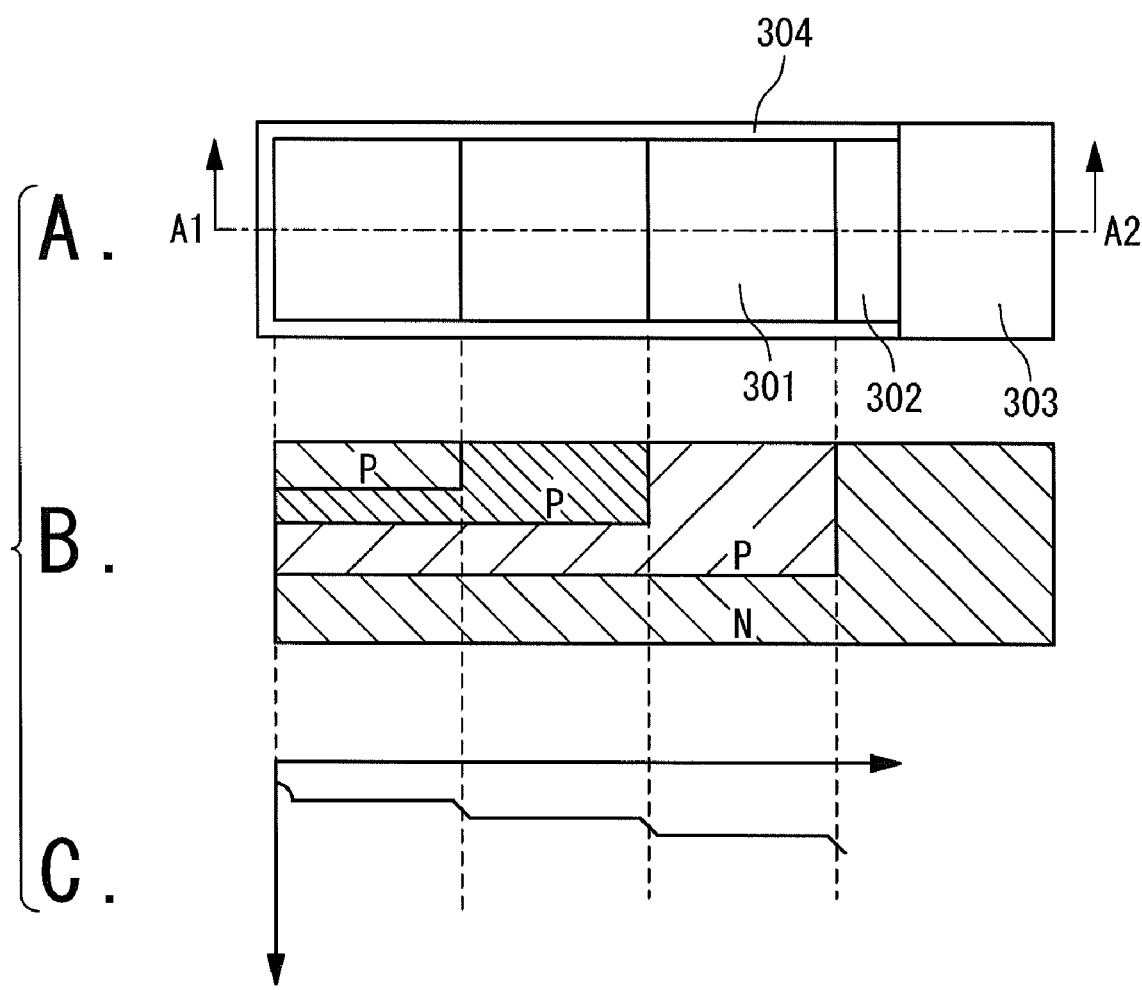
FIGS. 3A, 3B and 3C show the structure of a CCD image sensor studied by the inventor of the present invention.
Figure 4A:
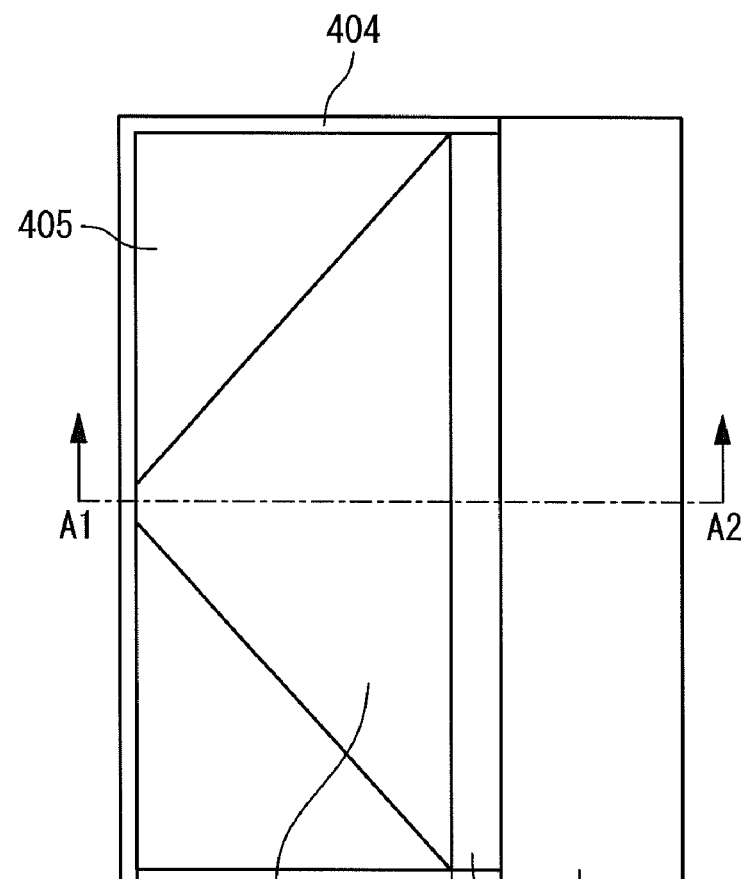
FIGS. 4A and 4B show the structure of the CCD image sensor with a tapered ion implantation region studied by the inventor of the present invention.
Figure 4B:
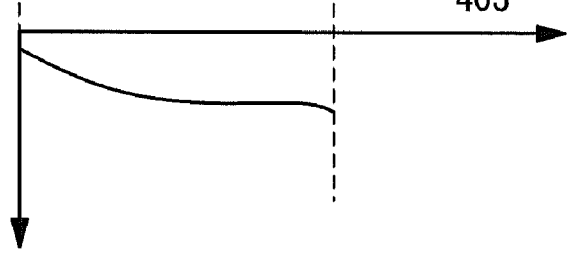
Figure 5A:
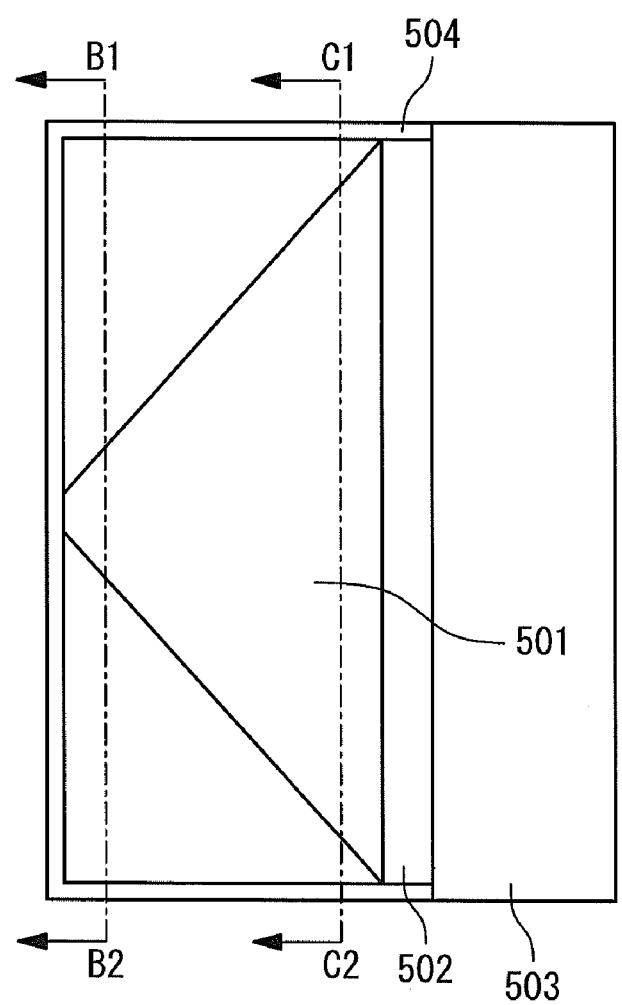
FIGS. 5A, 5B and 5C show the structure of the CCD image sensor with a tapered ion implantation region studied by the inventor of the present invention.
Figure 5B:
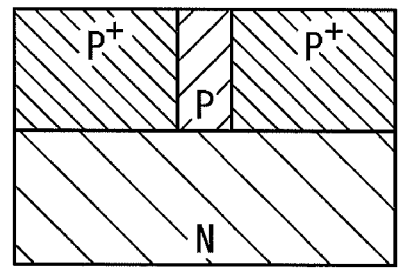
Figure 5C:
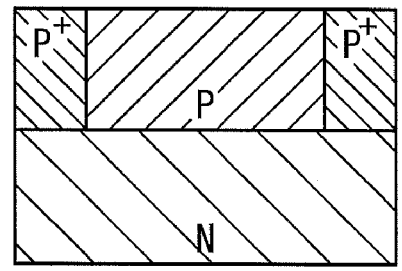

Hereinafter, a CCD image sensor according to the present invention will be described in detail with reference to the attached drawings.

[First Embodiment]

The CCD image sensor according to a first embodiment of the present invention will be described below. Here, the same reference numerals and symbols are assigned to the same components.

Figures 6A, 6B:
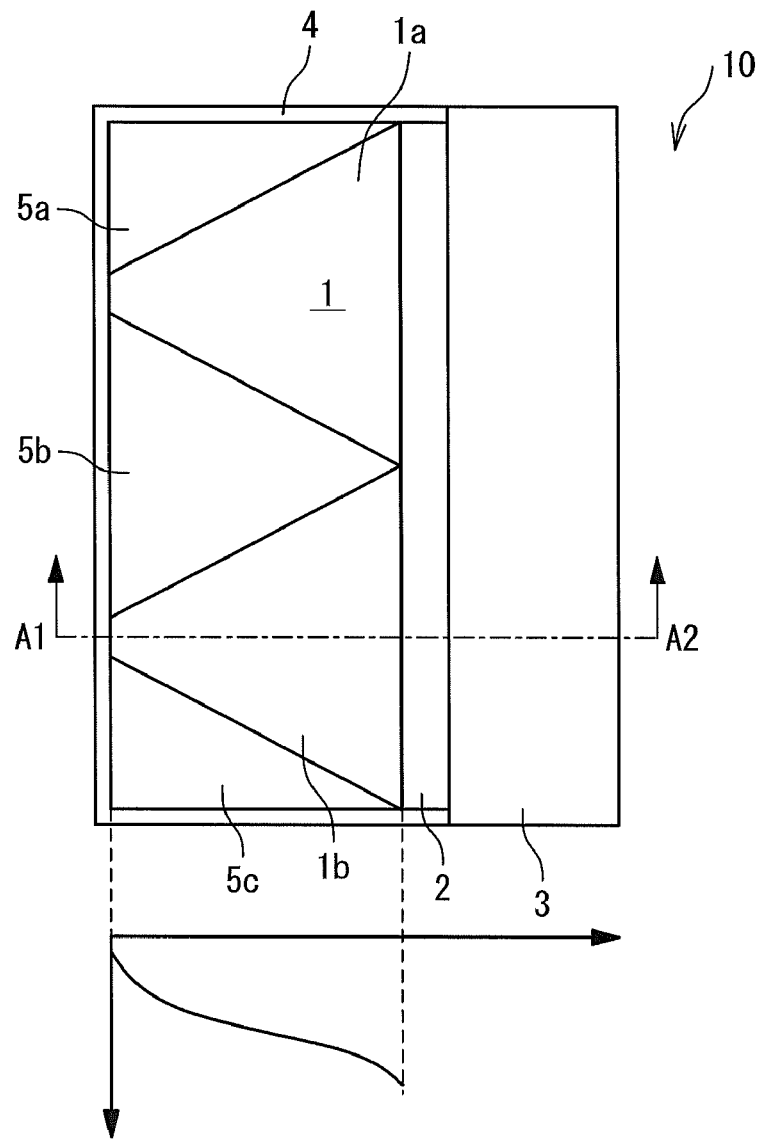
FIGS. 6A and 6B show a structure of a CCD image sensor according to a first embodiment of the present invention.

FIGS. 6A and 6B show the structure of the CCD image sensor according to the first embodiment of the present invention. FIG. 6A is a plan view of the CCD image sensor, and FIG. 6B is a diagram showing an inclined potential distribution along the line A1-A2 in FIG. 6A. In the CCD image sensor, the width and the length of one pixel are 20 μm and 10 μm, respectively.

The CCD image sensor 10 in the first embodiment contains a sequence of pixels, and one pixel (photo-diode region) 1 corresponds to a first tapered portion 1a, a second tapered portion 1b and tapered implantation regions 5a, 5b and 5c, and is surrounded by an element separation region 4, as shown in FIGS. 6A and 6B. The tapered implantation regions 5a, 5b and 5c have an impurity level higher than those of the first and second tapered portions 1a and 1b. The first tapered portion 1a and the second tapered portion 1b are connected through a single transfer gate 2 to a CCD register 3. In other words, in the CCD image sensor 10, the first tapered portion 1a and the second tapered portion 1b are formed to provide the narrow channel effect, that is, ion implantation is performed in the tapered implantation regions 5a, 5b and 5c such that the first and second tapered portions 1a and 1b are formed in one pixel.

In the CCD image sensor 10 in the first embodiment, even if the width of the pixel is wide, the proper inclined potential distribution can be generated because the number of tapers is set to 2 and the narrow channel effect is reserved. Specifically, the one pixel is divided such that the width of the tapered portion on the transfer gate side is set to be 10 μm or less. In this case, the pixel can be configured to provide the narrow channel effect only by changing a mask without changing the ion implantation condition. Thus, any defective read operation can be prevented.

Also, in the structure of the CCD image sensor 10 in the first embodiment, a mask to be added is only one even if the pixel length becomes long. Unlike the Patent Literature 1, there is no fear that the cost is increased proportionally to the pixel length, in the present invention. Also, even in the wide pixel, the inclined potential distribution can be generated by forming a plurality of tapered portions. Thus, a dose amount in the tapered implantation regions is not required to be increased. Therefore, because the p-n junction for the photo-electric conversion is eliminated, the uniform sensibility can be acquired in the entire pixel.

[Second Embodiment]

Figure 7:
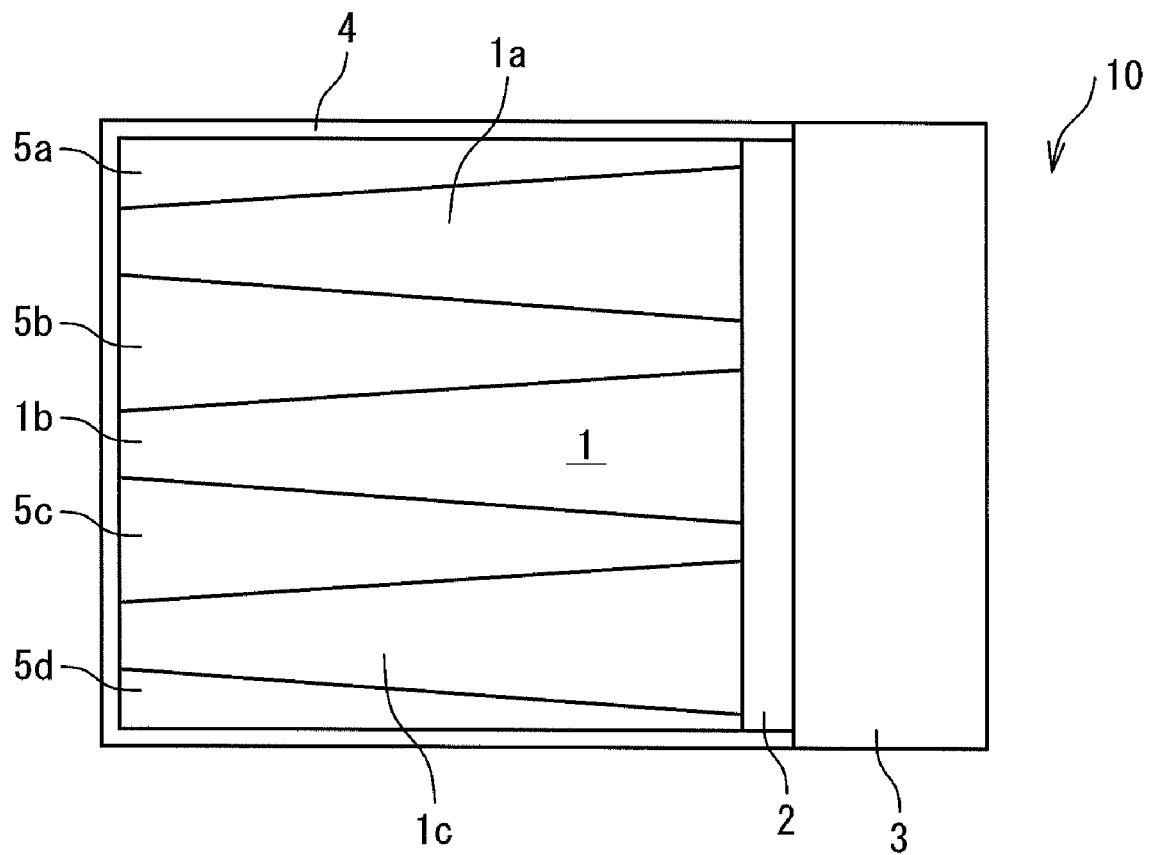
FIG. 7 is a plan view showing the structure of the CCD image sensor according to a second embodiment of the present invention.

The CCD image sensor according to a second embodiment of the present invention will be described below with reference to FIG. 7. FIG. 7 is a plan view showing the structure of the CCD image sensor 10 in the second embodiment. The CCD image sensor in the first embodiment has a structure of the two tapered portions 1a and 1b. As shown in FIG. 7, in the CCD image sensor 10 in the second embodiment, a pixel 1 has a first tapered portion 1a, a second tapered portion 1b, and a third tapered portion 1c arranged on the basis of the width of the pixel. Also, impurity is implanted in tapered implantation regions 5a, 5b, 5c and 5d to form the tapered potions 1a, 1b and 1c. In this way, when the width of the pixel becomes wider, if the plurality of tapered portions are formed on the basis of its width, the narrow channel effect similar to that of the first embodiment is reserved, which can generate the proper inclined potential distribution.

[Third Embodiment]

Figure 8:
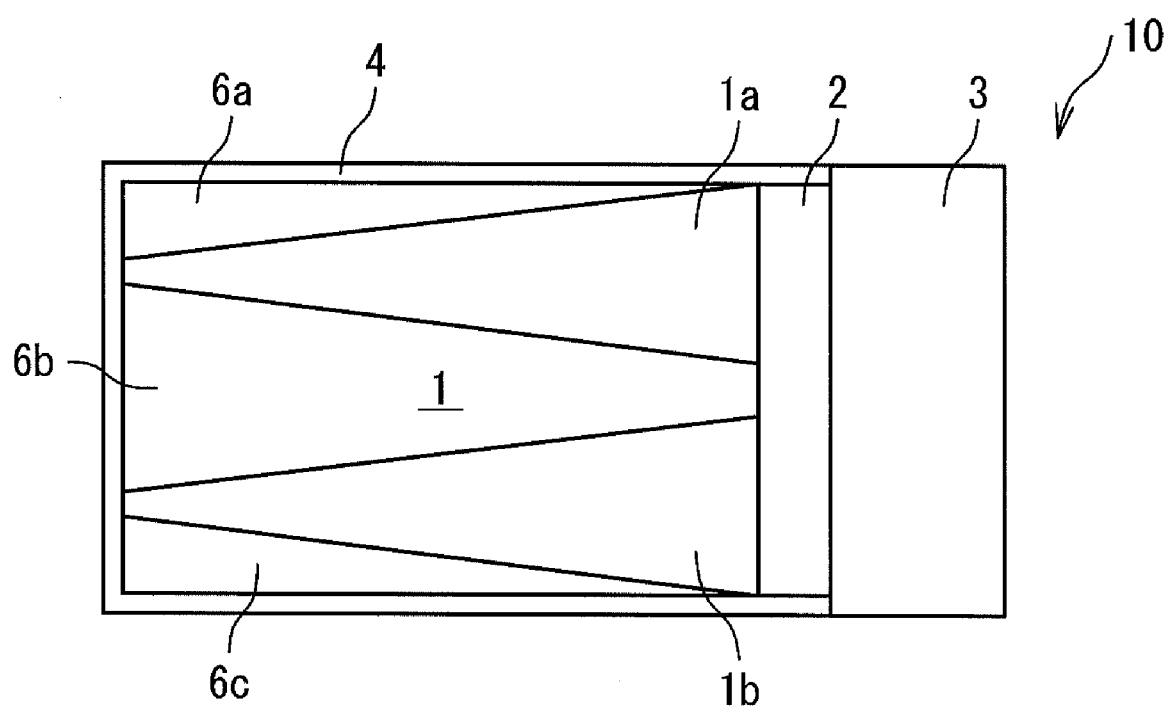
FIG. 8 is a plan view showing the structure of the CCD image sensor according to a third embodiment of the present invention.

The CCD image sensor 10 according to a third embodiment of the present invention will be described below with reference to FIG. 8. FIG. 8 is a plan view showing the structure of the CCD image sensor 10 in the third embodiment. In the CCD image sensor 10 in the first and second embodiments, the tapered portion is formed by the p-type impurity implantation. In the CCD image sensor 10 in the third embodiment, n-type impurity is implanted into tapered implantation regions 6a, 6b and 6c. Since the CCD image sensor 10 has the above structure, the CCD image sensor 10 similar to those of the first and second embodiments can be configured.

As mentioned above, the embodiments of the present invention have been specifically described. In the present invention, even if a large size pixel of the CCD image sensor having is used, a read operation can be performed without any read fault. Also, in the present invention, the optical detection can be uniformly attained in the entire pixel. Specifically, the number of tapered portions is not limited to one, and the plurality of tapered portions may be formed. Thus, even in the wide pixel, the narrow channel effect can be provided. Thus, the read operation can be improved. Since the number of tapered portions can be increased to improve the read operation efficiency, a dose amount of impurity in the ion implantation is not required to be increased. Therefore, the uniform sensibility can be attained in the entire pixel.

It should be noted that the present invention is not limited to the above-mentioned embodiments. Various modifications can be made in the range without departing from its scope and spirit. Also, the above embodiments can be combined in the range in which any confliction or contradiction does not occur in their configurations and operations.

What is claimed is:

1. A CCD image sensor comprising:
    a photo-diode region surrounded by an element separation region,
    the photo-diode region comprised of plural tapered portions;
    a CCD register; and
    a single transfer gate,
    wherein the CCD register is connected with said plural tapered portions through the single transfer gate, and
    wherein each of said plural tapered portions is formed to become wider in a direction of said single transfer gate.

2. The CCD image sensor according to claim 1, wherein said plural tapered portions are formed to have an identical shape.

3. The CCD image sensor according to claim 1, wherein each of said plural tapered portions has a width equal to or less than 10μm on a side of said single transfer gate.

4. The CCD image sensor according to claim 1, wherein said plural tapered portions are arranged in parallel to each other in a width direction of said photo-diode region.

5. The CCD image sensor according to claim 1, wherein said plural tapered portions are arranged in a width direction of said photo-diode region to provide a narrow channel effect.

6. A CCD image sensor comprising:
    a pixel comprised of a photo-diode region, the photo-diode region comprised of plural tapered portions and plural tapered implantation regions, the tapered implantation regions having an impurity level higher than an impurity level of the plural tapered portions;
    an element separation region, the plural tapered portions and the plural tapered implantation regions of the photo-diode region surrounded by the element separation region;
    a CCD register; and
    a single transfer gate associated with the photo-diode region, wherein the CCD register is connected with said plural tapered portions of the photo-diode region through the associated single transfer gate, and wherein each of said plural tapered portions is formed to become wider in a direction of said transfer gate.

7. The CCD image sensor according to claim 6, wherein said plural tapered portions are formed to have an identical shape.

8. The CCD image sensor according to claim 6, wherein each of said plural tapered portions has a width equal to or less than 10pm on a side of said single transfer gate.

9. The CCD image sensor according to claim 6, wherein said plural tapered portions are arranged in parallel to each other in a width direction of said photo-diode region.

10. The CCD image sensor according to claim 6, wherein said plural tapered portions are arranged in a width direction of said photo-diode region to provide a narrow channel effect.

11. The CCD image sensor according to claim 6, wherein one of said tapered implantation regions is located adjacent each tapered side of each said tapered region.

12. The CCD image sensor according to claim 6, wherein end portions of said transfer gate are surrounded by the element separation region.

* * * * *